United States Patent
Szmanda et al.

(10) Patent No.: US 7,429,627 B2
(45) Date of Patent: Sep. 30, 2008

(54) LEVELING AGENTS FOR CAST FERROELECTRIC POLYMER FILMS

(75) Inventors: Charles R. Szmanda, Westborough, MA (US); Kathleen B. Spear-Alfonso, Northboro, MA (US); Lujia Bu, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 162 days.

(21) Appl. No.: 10/795,848

(22) Filed: Mar. 8, 2004

(65) Prior Publication Data

US 2005/0004302 A1 Jan. 6, 2005

Related U.S. Application Data

(60) Provisional application No. 60/452,807, filed on Mar. 7, 2003.

(51) Int. Cl.
*C08K 3/00* (2006.01)
(52) U.S. Cl. ............... 524/522; 526/309; 526/317.1; 526/318.4
(58) Field of Classification Search ........... 524/522; 526/309, 317.1, 318.4
See application file for complete search history.

(56) References Cited

U.S. PATENT DOCUMENTS

2002/0143087 A1 10/2002 Haubennestel et al.

FOREIGN PATENT DOCUMENTS

| WO | WO 03/033603 A | 4/2003 |
| WO | WO 03/033603 A1 * | 4/2003 |

OTHER PUBLICATIONS

Document printed from web address: http://www.tudarmstadt.de/fb/ms/fg/em/Ferroelektrika.pdf;printed on Mar. 1, 2004.

* cited by examiner

*Primary Examiner*—Robert D. Harlan
(74) *Attorney, Agent, or Firm*—Peter F. Corless; Darryl P. Frickey; Edwards Angell Palmer & Dodge LLP

(57) ABSTRACT

A substituted (meth)acrylic copolymer leveling agent is useful in producing a ferroelectric polymer film that is especially suitable for use in a data processing device. Also disclosed is a a casting composition which includes the leveling agent, a film stack, and a data processing device comprising a ferroelectric film produced using the leveling agent.

4 Claims, No Drawings

LEVELING AGENTS FOR CAST FERROELECTRIC POLYMER FILMS

This application claims the benefit of U.S. Provisional Application(s) No(s). APPLICATION NO(S). 60/452,807 FILING DATE Mar. 7, 2003

BACKGROUND

The present invention relates to a leveling agent composition for use in forming ferroelectric polymer films and the films formed therewith, in particular, ferroelectric polymer films suitable for use in data processing devices.

Ferroelectrics are a class of dielectric materials that can be given a permanent electric polarization by application of an external electric field. Use of ferroelectric materials in data processing devices is disclosed in U.S. Patent Application No. US 2002/0044480 to Gudesen et al., which is directed to a ferroelectric data processing device comprising a thin film of ferroelectric material as a data-carrying medium. The film may be inorganic, a ceramic material, a polymer, or a liquid crystal. Use of ferroelectric polymers in data processing devices is also described, for example, by Y. Tajitsu et al., in "Investigation of Switching Characteristics of Vinylidene Fluoride/Trifluoroethylene Copolymers in Relation to Their Structures", (Japanese Journal of Applied Physics, Volume 26, pp. 554-560, 1987).

It is known that only certain vinylidene fluoride polymers are ferroelectric, and that the presence of ferroelectricity and other properties is due at least in part to polymer characteristics such as polymer composition, structure, molecular weight, molecular weight distribution, the thermal history of the film, and the solvent used to form the film. See, e.g., the Abstract of an article by Cho, in *Polymer*, Volume 15, p. 67 (1991). Recently, Tashiro et al., in Macromolecules, Volume 35, p. 714 (2002) performed a detailed structural analysis of the various vinylidene fluoride crystal morphologies. Vinylidene fluoride polymers occur in four distinct crystal morphologies, all monoclinic. Without intending to bound by theory, form I has essentially planar zigzag chains forming a polar structure in which $CF_2$ dipoles are parallel to each other along the crystallographic b-axis. The chains are tightly packed and tend to form large crystals. In form II, the $CF_2$ dipoles are packed in anti-parallel mode along the b-axis. Form II is therefore nonpolar and less tightly packed than form I. Form III is also a tightly packed polar unit cell, and is obtained by casting from highly polar (but not necessarily hydrogen bonding) solvents such as dimethylacetamide or dimethylformamide. Form III may also be obtained by annealing forms II or IV at high temperature. Finally, form IV is a polar structure in which the chains are packed in parallel mode. Form IV is also a desirable form from the standpoint of ferroelectric properties because it can interconvert with form II. Copolymers of vinylidene fluoride exhibit similar characteristics.

Ferroelectric polymer films may be formed by a variety of processes including by casting a composition comprising a ferroelectric polymer film precursor dissolved in a solvent onto a substrate, followed by removal of the solvent to produce the film. However, insufficient wetting of the substrate, compositional changes, and free energy gradients created by evaporation of the solvent can result in defects within the film, including orange peel and other defects that result from the formation of Bénard convection cells within the film as the solvent evaporates. See, for example, C. M. Hanson; P. E. Pierce; Cellular Convection in Polymer Coatings-An Assessment, 12 Ind. Eng. Chem. Prod. Res. Develop. 1973, p. 67.

In addition to Bénard convection cells, other variations in surface morphology can arise during the coating process, particularly in crystalline polymers. For example, during solvent evaporation, the surface of the film can have a surface free energy that is considerably higher than that of the original solution. The size of the critical nucleus for crystallite formation is usually correlated to the surface energy of the incipient film. Smaller numbers of relatively large, organized spherulitic crystal domains generally obtain in regions of high surface energy and larger numbers of small, less organized crystal domains arise in regions of low surface energy. In applications where ferroelectric materials are used in electronic devices in which the electrodes are in contact with the ferroelectric material, the crystal domain and electrode sizes should be such that the electrical signals obtained from polling different devices are similar. For example, a large number of small crystal domains, relative to the electrode size, have a statistically better chance of yielding substantially similar electrical signals from a plurality of device structures during polling than a smaller number of large crystal domains. Control of free energy gradients during film formation and annealing therefore influences device performance.

In addition to controlling film morphology, the ferroelectric film must adhere to the one or more surfaces with which it is in contact sufficiently strongly to prevent delamination during subsequent processing steps. Such delamination can, for example, result from thermal cycling, immersion in fluids, or mechanical stresses. It is therefore desirable that additives to the film provide improved adhesion as well as control of the film morphology.

Other desired improvements include reduced polling fatigue, as manifested by the diminution of the remnant polarization after repeated polling of the ferroelectric device.

Attempts to control or eliminate defects arising from nonuniformities in the ferroelectric film, delamination or polling fatigue include using co-solvents to change the film drying rate, using wetting agents to promote more even wetting of the substrate, or using surfactants to produce a more even surface tension throughout evaporation and cure of a film. In U.S. Pat. No. 6,340,720 to Lin et al., leveling agents are used to reduce defects in coatings comprising polyvinylidene fluoride coagulated with latex. While use of such leveling agents may improve some properties, they may also adversely affect properties that are important to use of the ferroelectric polymer film in a data processing device. For example, solvents, surfactants, and other processing aids may inhibit adhesion of the film to the support onto which it is being formed, may promote the formation of undesirable polymer crystal morphologies, or have other adverse affects. Accordingly, there remains a need in the art for methods and compositions for the manufacture of ferroelectric polymer films, particularly films suitable for use in a data processing devices, that are highly reproducible and that allow for control of film properties.

STATEMENT OF THE INVENTION

In one aspect of the present invention, a ferroelectric polymer film precursor composition comprises a ferroelectric polymer, a casting solvent, and a leveling agent including a (meth)acrylic copolymer represented by formula (I):

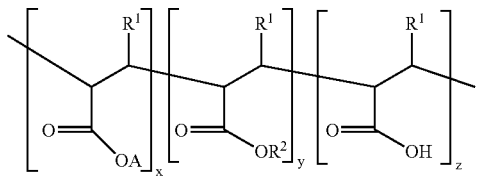

wherein each $R^1$ is independently a hydrogen or methyl group, A is $-CR^3R^4R^5$, wherein each $R^3$ is independently a hydrogen, substituted or unsubstituted $C_1$-$C_{20}$ linear or branched chain alkyl, alkenyl, alkynyl, cycloalkyl, cycloalkenyl, aryl, alkaryl, aralkyl, or heteroaryl moiety, and each $R^4$ and $R^5$ is independently a hydrogen, substituted or unsubstituted $C_1$-$C_{20}$ linear or branched chain linear or branched chain alkyl, alkenyl, alkynyl, cycloalkyl, cycloalkenyl, aryl, alkaryl, aralkyl, or heteroaryl moiety or $R^4$ and $R^5$ together form a $C_3$-$C_8$ cycloalkyl group, with the proviso that when $R^4$ and $R^5$ are each hydrogen, $R^3$ is not a linear alkyl group; $R^2$ comprises a substituted or unsubstituted $C_1$-$C_{20}$ linear or branched chain linear or branched chain alkyl, alkenyl, alkynyl, cycloalkyl, cycloalkenyl, aryl, alkaryl, aralkyl, or heteroaryl moiety, wherein the substituents on $R^2$, $R^3$, $R^4$, and $R^5$ may be halogen, hydroxyl, cyano, nitro, $C_1$-$C_{12}$ alkyl carboxy ester, acyl, $C_1$-$C_{12}$ alkoxy, carboxylate, or a mixture including one or more of the foregoing groups; x+y+z=100 mol %; x and y are each independently 10 to 70 mol %; and z is less than or equal to 40 mol %.

In another aspect, a process for forming a ferroelectric polymer film includes disposing onto a substrate a ferroelectric polymer film precursor composition including a ferroelectric polymer, a casting solvent, and a leveling agent, wherein the leveling agent includes a (meth)acrylic copolymer represented by formula (I); and removing at least a portion of the casting solvent to produce the ferroelectric polymer film.

Still further provided for is a ferroelectric polymer film including a layer of polymeric material formed from a ferroelectric polymer film precursor composition including a ferroelectric polymer, a casting solvent, and a leveling agent, wherein the leveling agent includes a (meth)acrylic copolymer represented by formula (I).

In another aspect, there is provided an adhesive layer for a ferroelectric polymer film, including a (meth)acrylic copolymer of formula (I).

In still another aspect, there is provided a data processing device including a ferroelectric polymer film formed from a ferroelectric polymer film precursor composition including a ferroelectric polymer, a casting solvent, and a leveling agent including a (meth)acrylic copolymer represented by formula (I), and wherein the ferroelectric polymer film is a continuous layer in contact with at least a first electrode structure and a second electrode structure to form a logic element array including substantially mutually parallel strip electrodes such that the electrode structures mutually form a substantially orthogonal x, y matrix, and a portion of the ferroelectric polymer film at an intersection between an x electrode and a y electrode of the electrode matrix forms a logic element of the logic element array, electrically connected to form the data processing device.

DETAILED DESCRIPTION

The ferroelectric polymer film precursor composition includes an organic ferroelectric polymer or prepolymer. Organic polymers that display ferroelectric properties and that are suitable for the formation of ferroelectric polymer films include, for example, certain polyamides (e.g., odd-numbered nylons), and ethylenically unsaturated, halogen-containing polymers formed from one or more polymerizable monomers such as, for example, vinylidene fluoride, tetrafluoroethylene, trifluoroethylene, chlorotrifluoroethylene, hexafluoropropene, vinylidene chloride, vinyl fluoride, and vinyl chloride. Oligomers and pre-polymers such as poly (vinylidene fluoride) and ethylene-tetrafluoroethylene alternating copolymer may also be used. These polymerizable monomers can be used either singly or as a combination of two or more co-monomers, such as terpolymers, tetrapolymers, and the like.

Non-halogenated co-monomers may also be present in the unsaturated, halogen-containing polymers to adjust the properties of the final film. Suitable non-halogenated co-monomers include, for example, acrylonitrile, acrylamide, methyl methacrylate, ethyl methacrylate, butyl methacrylate, octyl methacrylate, methacrylic acid, methyl acrylate, ethyl acrylate, butyl acrylate, octyl acrylate, 2-hydroxyethyl acrylate, glycidyl acrylate, acrylic acid, maleic anhydride, vinyl acetate, styrene, alpha-methyl styrene, trimethoxyvinylsilane, triethoxyvinylsilane, norbornene, butadiene, and mixtures comprising one or more of the foregoing co-monomers.

The nonhalogenated co-monomers, when present, may be employed in amounts of less than or equal 50 mol %, typically less than or equal to 30 mol %, more typically less than or equal to 20 mol % of the total polymer. When present, they are generally included in amounts of greater than or equal to 0.5 mol %, typically greater than or equal to 1 mol %, more typically greater than or equal to 2 mol % of the total polymer.

In one embodiment, the ferroelectric polymer or prepolymer includes vinylidene fluoride, optionally copolymerized with trifluoroethylene, hexafluoropropylene, or both. Vinylidene fluoride is present in a concentration of 10 to 100 mole percent (mol %), based on the total weight of the ferroelectric polymer. Within this range, a vinylidene fluoride concentration of greater than or equal to 50 mol % can be employed, with greater than or equal to 70 mol % preferred. Also preferred within this range is a vinylidene fluoride concentration of less than or equal to 90 mol %, with less than or equal to 85 mol % more preferred.

Trifluoroethylene, when present, typically includes up to 90 mol % of the total weight of the ferroelectric polymer. Within this range, a trifluoroethylene concentration of greater than or equal to 10 mol % can be employed, with greater than or equal to 20 mol % preferred. Also preferred within this range is a trifluoroethylene concentration of less than or equal to 50 mol %, with less than or equal to 30 mol % more preferred. Hexafluoropropylene, when present, preferably comprises up to 50 mol % of the total ferroelectric polymer. A hexafluoropropylene concentration of greater than or equal to 10 mol % can be employed, with greater than or equal to 15 mol % preferred.

Polymerization conditions for manufacture of these polymers or prepolymers are well known. For example, a small amount of an initiator, such as an organic peroxide, may be present. Once polymerization has occurred, the un-reacted monomers may be removed, by heating, by placing the polymer under a vacuum, by washing with an appropriate solvent, or a combination comprising at least one of the foregoing purification steps. The ferroelectric polymers or prepolymers used to form the films generally have a molecular weight of 5 to 400 kiloDaltons (kDa). Within this range, a molecular weight of greater than or equal to 20 kDa, preferably greater than or equal to 30 kDa can be employed, with less than or equal to 200 kDa preferred, and less than or equal to 100 kDa more preferred. Suitable ferroelectric polymers are commercially available, for example co-(vinylidene fluoride trifluoroethylene) is available from Solvay Corporation.

The ferroelectric polymer film precursor composition further includes a leveling agent. The leveling agent can enhance wetting of the support, adhesion of the film to the support, suppress formation of defects, suppress the formation of undesirable polymer crystal morphologies, reduce the surface roughness or a combination of one or more of the foregoing. Overall, the leveling agent aids in producing a uniform ferroelectric polymer film suitable for use in a data processing device. Manufacture of films using the leveling agent also is also more reproducible, i.e., produces films having more consistent properties.

The leveling agent preferably includes a (meth)(meth) acrylic copolymer having the following formula:

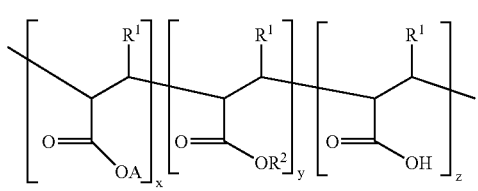

(I)

wherein each $R^1$ is independently a hydrogen (—H) or methyl group. "(Meth)acrylic" as used herein refers to both acrylic and methacrylic groups.

A in the above formula is —$CR^3R^4R^5$, wherein each $R^3$ is independently a hydrogen, substituted or unsubstituted $C_1$-$C_{20}$ linear or branched alkyl, alkenyl, alkynyl, cycloalkyl, cycloalkenyl, aryl, alkylaryl, aralkyl, or heteroaryl moiety, and each $R^4$ and $R^5$ is independently a hydrogen, substituted or unsubstituted $C_1$-$C_{20}$ linear or branched chain alkyl, alkenyl, alkynyl, cycloalkyl, cycloalkenyl, aryl, alkaryl, aralkyl, or heteroaryl moiety, or $R^4$ and $R^5$ together form a $C_3$-$C_8$ cycloalkyl group, with the proviso that when $R^4$ and $R^5$ are each hydrogen, $R^3$ is not a linear alkyl group. A is thus a branched chain carbon-containing group. Preferably, A has the formula —$CH_2CR^4R^5$, wherein $R^4$ and $R^5$ are each independently a $C_1$-$C_{10}$ linear or branched alkyl, alkenyl, or alkaryl group, or a $C_3$-$C_{10}$ cycloalkyl or cycloalkenyl group. More preferably, $R^4$ and $R^5$ are each independently a $C_1$-$C_6$ linear or branched alkyl or alkenyl group.

$R^2$ is a substituted or unsubstituted $C_1$-$C_{20}$ linear or branched alkyl, alkenyl, alkynyl, cycloalkyl, cycloalkenyl, aryl, alkylaryl, aralkyl, or heteroaryl moiety. Each of $R^2$, $R^3$, $R^4$, and $R^5$ may be substituted by groups that do not interfere with synthesis or use of the ferroelectric polymer. Suitable substituents include, for example, halogen (i.e., fluorine, chlorine, bromine, iodine), hydroxyl (—OH), cyano (—CN), nitro (—$NO_2$), $C_1$-$C_{12}$ alkoxy, $C_1$-$C_{12}$ alkylcarboxy ester, carboxylate (—$COO^-$ $M^+$, wherein M is a hydrogen or other counterion), or a mixture comprising one or more of the foregoing groups.

Subscripts x, y and z represent molar percents (mol %) such that the sum of x, y, and z totals 100 mol % (i.e., x+y+z=100 mol %). Subscripts x and y each independently vary from 10 to 70 mol %, with the proviso that x+y=60 mol % or more.

Subscript z is less than or equal to 40 mol %. Values less than or equal to 30% are preferred, and less than or equal to 20 mol % more preferred. When z is greater than zero, it may be as low as 0.01 mol %.

The leveling agent is preferably present at 0.001 to 1.0 wt %, based on the total weight of the ferroelectric polymer present in the precursor composition. Within this range, a concentration of less than or equal to 1.0 wt % is preferred, with less than or equal to 0.5 wt % more preferred. Also preferred within this range is a concentration of greater than or equal to 0.005 wt %, with greater than or equal to 0.05 wt % based on the total weight of the ferroelectric polymer present in the casting composition more preferred.

Methods for the synthesis of the above-described (meth) acrylic polymers are disclosed, for example in U.S. Pat. No. 5,621,059, and generally comprise the bulk polymerization of blends of monomer units in the desired ratio. Monomers and initiators can be charged simultaneously at the beginning of the reaction, or be introduced separately and at different rates during the reaction, using controlled addition methods of the kind described, for example, in U.S. Pat. No. 5,876,899. Alternatively, monomers may be added to the reaction during the course of reaction, individually or in mixtures, at the same or different rates to control polymer sequence and distribution.

Typical organic radical initiators are known in the art and include, for example, peroxides, for example diethyl ether peroxide; peresters, for example t-butyl peroctoate; peranhydrides, for example benzoyl peroxide; keto compounds; organic sulfur compounds, for example methyl mercaptan; trihalomethane compounds, for example, 3-bis(trichloromethyl)-5-(2'-chlorophenyl)-s-triazine and 1,3-bis(trichloromethyl)-5-(4'-methoxyphenyl)-s-triazine; azo compounds; azide compounds; and the like. Specific keto compounds include, for example, diacetyl, benzoin, 2-hydroxy-2-methyl-1-phenylpropan-1-one, 1-(4-isopropylphenyl)-2-hydroxy-2-methylpropan-1-one, 4-(2-hydroxyethoxy)phenyl-2-(hydroxy-2-propyl)ketone, 1-hydroxycyclohexylketone, 2,2-dimethoxy-2-phenylacetophenone, 2-benzyl-2-dimethylamino-1-(4-morpholinophenyl)-butan-1-one, benzophenone, 4,4'-bis(dimethylamino)benzophenone, 4,4'-bis(diethylamino)benzophenone 2,4-diethylthioxanthone and 3,3-dimethyl-4-methoxybenzophenone. Specific examples of the azo or azide compound include azoisobutyronitrile, 4-azidobenzaldehyde, 4-azidoacetophenone, 4-azidobenzalacetophenone, 4-azidobenzalacetone, azidopyrene, 4-diazodiphenylamine, 4-diazo-4'-methoxydiphenylamine and 4-diazo-3'-methoxydiphenylamine, and the like. Mixtures of organic radical initiators may be used.

Stable free radical initiators can also be used, for example 2,2,5,5-tetramethyl-1-pyrrolidinyloxy, sold under the trade name PROXYL; 2,2,6,6-tetramethyl-1-piperidinyloxy, generally sold under the trade name TEMPO; 4-hydroxy-2,2,6,6-tetramethyl-1-piperidinyloxy, sold under the trade name 4-hydroxy-TEMPO; or bis(1-oxyl-2,2,6,6-tetramethylpiperidin-4-yl) sebacate, sold under the trade name CXA 5415 by Ciba Specialty Chemicals. Other stable free radical initiators include N-tert-butyl-1-phenyl-2-methylpropyl nitroxide, N-tert-butyl-1-(2-naphthyl)-2-methylpropyl nitroxide, N-tert-butyl-1-diethylphosphono-2,2-dimethylpropyl nitroxide, N-tert-butyl-1-dibenzylphosphono-2,2-dimethylpropyl nitroxide, N-phenyl-1-diethylphosphono-2,2-dimethylpropyl nitroxide, 4-oxo-2,2,6,6-tetramethyl-1-piperidinyloxy or 2,4,6-tri(tert-butyl)phenoxy. Mixtures of free radical initiators may be used. A suitable acrylic polymer is available under the trade name MODAFLOW from Solutia Corporation.

The ferroelectric polymer film precursor composition may further contain other surface active agents to improve coating properties in addition to those described above. Combinations of the above-described (meth)acrylic surface active agents with additional surface active agents can exhibit synergistic properties such as at least one of adhesion improvements, improvements in film morphology or lower polling fatigue that do not obtain to the same degree from formulations containing the individual surface active agents. Suitable additional surface active agents include, for example, polyoxyethylene lauryl ether, polyoxyethylene octyl phenyl ether, polyoxyethylene nonyl phenyl ether, polyoxyethylene glycol dilaurate, polyoxyethylene glycol distearate, as well as organofluoro surfactants including those available commercially under the trade names Megafax F171, F172, F173, F471, R-07, R-08, (Dainippon Ink & Chemicals, Incorporated), Fluorad FC171, FC430, FC431 (3M Corporation), ASAHI GUARD AG710, Surflon S-382, SC-101, SC-102, SC-103, SC-104, SC-105, SC-106 (Asahi Glass Co., Ltd.), KP341 (Shin-Etsu Chemical Co., Ltd.), Polyflow No.75, No. 95 (Kyoeisha Chemical Co., Ltd.), Silwet L-7604 (Witco Chemical Corp.), and NBX-7, NBX-8, and NBX-15 (NEOS Company Limited).

The ferroelectric polymer films may be formed from the precursor compositions by wet processes using solvents and dispersions. Such processes include, for example, casting, blade coating, roll coating, spin coating, dipping, and spray coating, as well as printing methods such as lithography, relief printing, intaglio, perforated plate printing, screen-printing, and transfer printing. Still other wet processes include electrochemical methods such as electrodeposition, electropolymerization, micelle electrolysis (see, for example, JP-A-63-243298), and Langmuir blow-jet methods using monomolecular films formed on water). The process by which the ferroelectric polymer precursors are formed into films can also include a combination comprising at least one of the foregoing processes, spin coating methods being more preferred. In casting and other wet processes, the ferroelectric polymer precursor composition is dissolved or dispersed in a casting solvent to form a casting composition. Suitable solvents may include a single solvent or a mixture of miscible solvents, and are those that dissolve (or suspend) and retain the polymer in solution (or suspension), preferably with other solutes that may be present in the precursor composition, through a range of concentrations. The solvent is typically effective to provide a solution (or dispersion) comprising at least 4 weight % (wt %) of the precursor composition, more typically greater than 8 wt %, and still more typically greater than 10 wt %. The solvent furthermore is one that evaporates to form a smooth, preferably defect-free film. In addition it is preferable from a manufacturing standpoint that the solvent not pose a significant health or safety hazard to users, for example by having a flashpoint higher than 38° C. (100° F.).

Useful casting solvents frequently exhibit boiling points greater than or equal to 100° C. Accordingly, solvents and solvent mixtures with boiling points greater than or equal to 100° C. are preferred. Useful casting solvents that give low-defect films usually have relative evaporation rates at 25° C. equal to or less than that of n-butyl acetate. Accordingly, solvents with evaporation rates at 25° C. less than or equal to that of n-butyl acetate are preferred. Suitable solvents include, for example, 2-heptanone, diethyl carbonate, isobutyl isobutyrate, ethyl benzene, 1-decanol, 1-isopropyl-2-methylimidazole, ethyl lactate, 2-hexyl acetate, diethylene glycol butyl ether acetate, diethylketone, 1-methoxy-2-butanol, propylene glycol methyl ether acetate and mixtures comprising at least one of the foregoing solvents.

Solutions can be filtered by depth filtration using, for example, materials such as diatomaceous earth or a filter cake comprising fibrous materials such as cellulose fibers. Alternatively, or in addition, solutions can be filtered by absolute filtration using, for example, commercially available absolute filters with compatible media such as polyethylene, polytetrafluoroethylene, nylon or the like, and with filter ratings from 0.01 to 1.0 um (micrometers) absolute as required by the application.

In practice, the film is formed from the casting composition by one or more of the above-described film-forming methods. For example, in spin casting, a solution comprising 1 to 10 weight percent (wt %) of the film forming polymer and optional additives is applied to a substrate rotating at 500 to 10,000 revolutions per minute (RPM) at a temperature of 15 to 30° C. The spin-coated film is then heated, e.g., baked on a hotplate, at 80 to 150° C.

Films formed using the above described leveling agents have improved properties that may be adjusted depending on the desired end use. The films have an average roughness, as measured as a mean-square deviation using atomic force microscopy (AFM), of 300 angstroms (Å) or less, with less than or equal to 150 Å preferred, less than or equal to 100 Å more preferred, and less than or equal to 75 Å most preferred. In one embodiment, the surface roughness is 1 Å to 100 Å. A film formed using the above described leveling agent has a decreased roughness compared to films produced without the leveling agent, which is desirable for reproducibility, reliability, reduced polling fatigue, good electrode contact, and dense packing in data processing devices.

In addition, the ferroelectric polymer film has an average crystal domain size, as measured by AFM of 1 to 10 nanometers. Within this range, an average domain size of less than or equal to 8 nanometers is preferred, with less than or equal to 6 nanometers more preferred, and less than or equal to 2 nanometers still more preferred. Again, a film formed using the above described leveling agent has a decreased average domain size compared to a film produced without the leveling agent, which is desirable for reproducibility, reliability, reduced polling fatigue, good electrode contact, and dense packing in data processing devices.

A variety of other film properties may be adjusted by appropriate selection and use of the above described leveling agent including polydispersity, properties related to hysteresis (e.g., saturation potential, coercive field strength, and permittivity), reliability (e.g., fatigue, aging, time dependence dielectric breakdown, imprint, and relaxation), kinetic properties (e.g., ferroelectric switching time), and thermodynamic properties (e.g., Curie transition temperature of the film).

The ferroelectric polymer films can have a polydispersity of 1 to less than or equal to 3, preferably less than or equal to 2, with less than or equal to 1.5 more preferred, and less than or equal to 1.2 most preferred.

Hysteresis is the observed lagging or retardation of the polarization effect when the electric field acting upon a ferroelectric polymer film is changed from a previously induced condition. The shape and magnitude of a hysteresis loop are characteristic of a particular ferroelectric material. The hysteresis can be shown graphically in a plot of the observed polarization (P) verses the magnitude of the applied electric field (E). The shape and magnitude of a hysteresis loop are characteristic of a particular ferroelectric material. For example, as the electric field is increased, the crystalline domains of the film become oriented with the field. When no further reorientation can occur, the curve becomes flat. The polarization value at the intersection of a line extrapolated to the polarization axis at E=0 is the saturation polarization (designated Psat). The magnitude of the polarization at E=0 on the hysteresis loop is the remnant polarization (designated Pr).

The difference between the remnant polarization and the saturation polarization of the ferroelectric polymer film may be measured according to Fedosov, (see Electrical Properties of Ferroelectric Polymers During the Switching of Polarization, Sergiy Fedosov; http://www.tu-darmstadt.de/fb/ms/fg/em/Ferroelektrika.pdf). The preferred difference is 0.1 to 70 millicoulombs per square meter ($mC/m^2$). Within this range, a difference of less than or equal to 50 $mC/m^2$ is preferred, and less than or equal to 25 $mC/m^2$ more preferred. The coercive field strength is defined as the horizontal intercept of the hysteresis loop (designated Ec). Preferably the ferroelectric polymer film has a coercive field strength of 20-80 mega Volts per meter (MV/m) consistent with a more square hysteresis loop, as compared to, for example, pure vinylidene fluoride polymers. Also, the ferroelectric polymer film preferably has a coercivity field strength as measured according to Christie et al., J. Polymer Sci.: Part B, Vol. 35, p. 2671, (1997) of 20 to 80 MV/m. Within this range, a coercivity field strength of less than or equal to 70 MV/m is preferred, and less than or equal to 50 MV/m more preferred. Another property of ferroelectric polymer films is differential permittivity, which is the slope of the hysteresis loop measured at any point on the curve. The differential permittivity of the ferroelectric material at Ec is preferably 0.5 to 15 nanocoulombs per meter per volt (nC/m*V). Within this range, a differential permittivity of greater than or equal to 1 is preferred, and greater than or equal to 2.5 nC/m*V more preferred.

As is known, transforming the polymer from a ferroelectric state into a paraelectric state can destroy the ferroelectric properties of a polymer film. These same properties can be made to reappear upon subsequent conversion of the polymer back into a ferroelectric state. Such changes in thermodynamic states can be brought about by changes in temperature. The Curie transition temperature, often abbreviated as Tc, is the temperature at which this change occurs. The Curie transition temperature of the ferroelectric polymer film is preferably greater than 90° C. A Curie transition temperature of greater than or equal to 100° C. is preferred, and greater than or equal to 110° C. more preferred. In one embodiment, the Curie transition temperature is 90 to 145° C.

The ferroelectric polymer film may be used in the form in which it was originally prepared, or it may undergo additional processing steps, for example crosslinking, irradiation with an electron beam having an energy greater than 5 kiloelectron volts (keV) and a dose greater than 0.5 micro Curies per square centimeter ($\mu C/cm^2$), or irradiation with x-radiation having a wavelength of less than 20 nm and a dose greater than 1 milli Joule square centimeter ($mJ\ cm^2$). The film may also be stretched along one or more axes; heat treated by, e.g., annealing, at a temperature of from 100° C. to 130° C., for 1 minute to 12 hours; the film may be coated with a conducting or semiconducting passivation layer such as colloidal graphite, a conducting polymer such as partially ionized polythiophene, PEDOT-PSS or partially ionized polyaniline, or evaporated small molecules such as 2-amino-1H-imidazole-4,5-dicarbonitrile, and evaporated donor-accepter complexes such as tetrathiafulvalene-tetracyanoquinodimethane, or may have an inorganic layer such as indium-tin oxide. The additional conditioning steps may also include any combination comprising at least one of the foregoing treatments.

The thickness of the ferroelectric polymer film is dependent on the final application. For example, when the ferroelectric polymer film is to be used in a data processing device, the film preferably has a thickness of 15 to 300 nm. Within this range, a thickness of greater than or equal to 20 nm is preferred. Also preferred within this range is a thickness of less than or equal to 50 nm with less than or equal to 25 nm more preferred.

In another embodiment, the (meth)(meth)acrylic copolymer leveling agent can be used as an adhesive for a ferroelectric polymer film. For example, the leveling agent can be used to form an additional layer in a film stack. Such a film stack includes a (meth)(meth)acrylic copolymer leveling agent layer disposed on a substrate, and a ferroelectric polymer film disposed on the leveling agent layer. The (meth)acrylic copolymer leveling agent layer can be disposed on the substrate or the film by, for example, casting or another wet process in which a solution of the leveling agent and a solvent is disposed on the substrate or film. The ferroelectric polymer precursor composition may or may not comprise additional (meth)acrylic copolymer leveling agent. The ferroelectric polymer layer is formed by the above described methods.

The ferroelectric polymer film or film stack is typically used in a data processing device, including, for example, a logic element configured memory cells as described in United States Patent Application No. US 2002/0044480 to Gudesen et al. For example, a data storage device wherein a ferroelectric polymer film is located typically as a continuous layer or sheet between a first and a second electrode structure of strip electrodes. The first and the second electrode structure are dimensioned, located and positioned to form a two-dimensional x, y-matrix with, for example, the x electrodes being columns in the matrix, and the y electrodes being rows in the matrix. The portion of the ferroelectric polymer film at an intersection between an x electrode and a y electrode of the electrode matrix forms a logic element electrically connected to respective driver and control circuits for driving the electrodes and detection of output signals, thus forming the data processing device. The data processing device may also include a plurality of logic element arrays stacked one on top of another and electrically isolated from one another by a layer of an electrically isolating material provided between each of the logic element arrays. In turn, each of the logic elements of each of the logic element arrays is electrically connected to form the data processing device.

Suitable electrode materials include, for example alkaline earth metals, transition metals, transition metal oxides, main group metals, Group IV semiconductors, Group III-V semiconductors, Group II-VI semiconductors, semiconductors comprising main group oxides such as indium tin oxide (ITO), and the like, as well as combinations, for example alloys, comprising at least one of the foregoing materials. Organic semiconductors may also be used, for example polyaniline, polythiophene, polymerized or oligomerized thiophene derivatives such as poly (2,3-dihydro-thieno[3,4-b][1,4]dioxine), poly arylene vinylenes such as polyphenylene vinylene, and the like, as well a combinations, for example alloys comprising at least one of the foregoing organic semiconductors. The degree of partial oxidation or partial reduction of the semiconducting polymer can be selected to optimize device performance. Electrode materials disposed about the ferroelectric polymer can be the same or different and can be selected to give optimum electronic performance. Moreover, electrodes can include a plurality of conducting and/or semiconducting layers.

Dielectric materials, for example, silicon dioxide, silicon nitride, silicon oxynitride, titanium nitride, aluminum oxide, or nonconducting polymers can be interposed between the electrode and the ferroelectric film, as long as the dielectric is sufficiently thin to allow a sufficiently high field strength in the ferroelectric film.

The use of the (meth)acrylic copolymer leveling agent provides several advantages including one or a combination of enhanced adhesion to the substrate, suppression of formation of Benard convection cells, and suppression of formation of undesirable crystal morphologies during drying. The films also have a decreased roughness and average domain size compared to films formed without the leveling agent, which is desirable for reproducibility, reduced polling fatigue, good electrode contact and dense packing in data processing devices.

The invention is further illustrated by the following non-limiting examples. The polymer used in the examples was a 78%/22% mol/mol copolymer of vinylidene fluoride and trifluoroethylene with Mn=125,000 and Mw=167,000 Daltons.

EXAMPLE 1 (COMPARATIVE)

A 78%/22% mol/mol copolymer of vinylidene fluoride and trifluoroethylene (2.7 g) is dissolved in diethyl carbonate (97.3 g) to give a clear solution. The resulting solution is filtered using a 0.2 um (micrometer) absolute filter.

The filtered solution is then spin coated on a vacuum vapor primed silicon wafer at 2500 revolutions per minute (RPM) for 30 seconds (sec), baked on a proximity hotplate at 120° C. for 60 sec and chilled on a 20° C. cold plate for 30 sec to give a cast film thickness of approximately 65 nanometers (nm). Typically, large spherulitic crystal domains are evident.

An X-cut of approximately 1 inch (2.54 cm) long by ¾ inch (1.90 cm) wide is made in the cast film down to the substrate using a sharp razor blade. A 3 inch (7.62 cm) strip of ¾ inch (1.90 cm) wide semitransparent pressure sensitive tape (Scotch Magic Tape made by the 3M Corporation or similar) is then applied to the X-cut and pulled sharply away from the coating surface. Typically, a large area of the cast film beyond the area of the applied tape is removed from the substrate.

EXAMPLE 2 (COMPARATIVE)

A 78%/22% mol/mol copolymer of vinylidene fluoride and trifluoroethylene (2.7 g) is dissolved in propylene glycol methyl ether acetate (97.3 g) to give a clear solution. The resulting solution is filtered using a 0.2 um absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, some small spherulitic crystal domains are evident.

An X-cut of approximately 1 inch (2.54 cm) long by ¾ inch (1.90 cm) wide is made in the cast film down to the substrate using a sharp razor blade. A 3 inch (7.62 cm) strip of ¾ inch (1.90 cm) wide semitransparent pressure sensitive tape (Scotch Magic Tape made by the 3M Corporation or similar) is then applied to the X-cut and pulled sharply away from the coating surface. Typically, a large area of the cast film beyond the area of the applied tape is removed from the substrate.

EXAMPLE 3

A 78%/22% mol/mol copolymer of vinylidene fluoride and trifluoroethylene (2.7 g) along with a 40%/60% mol/mol copolymer of 2-ethylhexyl acrylate and ethyl acrylate (0.0108 g) are dissolved in propylene glycol methyl ether acetate (97.289 g) to give a clear solution. The resulting solution is filtered using a 0.2 um absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, no spherulitic crystal domains are evident.

An X-cut of approximately 1 inch (2.54 cm) long by ¾ inch (1.90 cm) wide is made in the cast film to the substrate using a sharp razor blade. A 3 inch (7.62 cm) strip of ¾ inch (1.90 cm) wide semitransparent pressure sensitive tape (Scotch Magic Tape made by the 3M Corporation or similar) is applied to the X-cut and pulled sharply away from the coating surface. Typically, portions of the cast film under the applied tape remain. There is no removal of the film beyond the boundaries of the applied tape.

EXAMPLE 4

A 78%/22% mol/mol copolymer of vinylidene fluoride and trifluoroethylene (2.7 g) along with a 40%/50%/10% mol/mol/mol terpolymer of 2-ethylhexyl acrylate, ethyl acrylate and acrylic acid (0.0108 g) are dissolved in propylene glycol methyl ether acetate (97.289 g) to give a clear solution. The resulting solution is filtered using a 0.2 um absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, no spherulitic crystal domains are evident.

An X-cut as above is made in the cast film to the substrate using a sharp razor blade. A 3 inch (7.62 cm) strip of ¾ inch (1.90 cm) wide semitransparent pressure sensitive tape (Scotch Magic Tape made by the 3M Corporation or similar) is applied to the X-cut and pulled sharply away from the coating surface. Typically, most of the cast film under the applied tape remains. There is no removal of the film beyond the boundaries of the applied tape.

EXAMPLE 5

A 78%/22% mol/mol copolymer of vinylidene fluoride and trifluoroethylene (2.7 g) along with a 40%/50%/10% mol/mol/mol terpolymer of 2-ethylhexyl acrylate, butyl acrylate and acrylic acid (0.0108 g) are dissolved in propylene glycol methyl ether acetate (97.289 g) to give a clear solution. The resulting solution is filtered using a 0.2 um absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, no spherulitic crystal domains are evident.

An X-cut as above is made in the cast film to the substrate using a sharp razor blade. A 3 inch (7.62 cm) strip of ¾ inch (1.90) wide semitransparent pressure sensitive tape (Scotch Magic Tape made by the 3M Corporation or similar) is applied to the X-cut and pulled sharply away from the coating surface. Typically, most of the cast film under the applied tape remains. There is no removal of the film beyond the boundaries of the applied tape.

EXAMPLE 6

A 78%/22% mol/mol copolymer of vinylidene fluoride and trifluoroethylene (2.7 g) along with a 40%/50%/10% mol/mol/mol terpolymer of 2-ethylhexyl methacrylate, ethyl methacrylate and methacrylic acid (0.0108 g) are dissolved in propylene glycol methyl ether acetate (97.289 g) to give a clear solution. The resulting solution is filtered using a 0.2 um (micron) absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, no spherulitic crystal domains are evident.

An X-cut as above is made in the cast film to the substrate using a sharp razor blade. A 3 inch (7.62 cm) strip of ¾ inch (1.90 cm) wide semitransparent pressure sensitive tape (Scotch Magic Tape made by the 3M Corporation or similar) is applied to the X-cut and pulled sharply away from the coating surface. Typically, most of the cast film under the applied tape remains. There is no removal of the film beyond the boundaries of the applied tape.

EXAMPLE 7

A 78%/22% mol/mol copolymer of vinylidene fluoride and trifluoroethylene (2.7 g) along with a 40%/60% mol/mol copolymer of 2-ethylhexyl acrylate and ethyl acrylate (0.0108 g) are dissolved in diethyl carbonate (97.289 g) to give a clear solution. The resulting solution is filtered using a 0.2 um absolute filter.

The filtered solution is then spin coated on a vacuum vapor primed silicon wafer at 2500 RPM for 30 sec, baked on a proximity hotplate at 120° C. for 60 sec and chilled on a 20° C. cold plate for 30 sec to give a cast film thickness of approximately 65 nm. Typically, no spherulitic crystal domains are evident.

An X-cut as above is made in the cast film to the substrate using a sharp razor blade. A 3 inch (7.62 cm) strip of ¾ inch (1.90 cm) wide semitransparent pressure sensitive tape (Scotch Magic Tape made by the 3M Corporation or similar) is applied to the X-cut and pulled sharply away from the coating surface. Typically, portions of the cast film under the applied tape remain. There is no removal of the film beyond the boundaries of the applied tape.

What is claimed is:

1. A ferroelectric film precursor composition, comprising
a ferroelectric polymer or prepolymer,
a casting solvent, and
a leveling agent comprising a (meth)acrylic copolymer represented by formula (I):

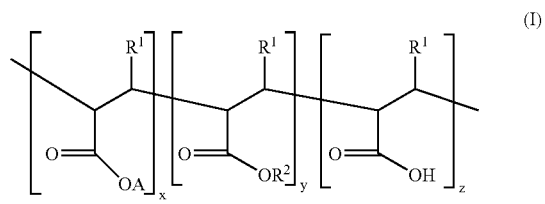

wherein
each $R^1$ is independently a hydrogen or methyl group,
A is —$CR^3R^4R^5$,
wherein
each $R^3$ is independently a hydrogen, substituted or unsubstituted $C_1$-$C_{20}$ linear or branched chain alkyl, alkenyl, alkynyl, cycloalkyl, cycloalkenyl, aryl, alkaryl, aralkyl, or heteroaryl moiety, and
each $R^4$ and $R^5$ is independently a hydrogen, substituted or unsubstituted $C_1$-$C_{20}$ linear or branched chain linear or branched chain alkyl, alkenyl, alkynyl, cycloalkyl, cycloalkenyl, aryl, alkaryl, aralkyl, or heteroaryl moiety or $R^4$ and $R^5$ together form a $C_3$-$C_8$ cycloalkyl group, with the proviso that when $R^4$ and $R^5$ are each hydrogen, $R^3$ is not a linear alkyl group;
$R^2$ comprises a substituted or unsubstituted $C_1$-$C_{20}$ linear or branched chain linear or branched chain alkyl, alkenyl, alkynyl, cycloalkyl, cycloalkenyl, aryl, alkaryl, aralkyl, or heteroaryl moiety, wherein the substituents on $R^2$, $R^3$, $R^4$, and $R^5$ may be halogen, hydroxyl, cyano, nitro, $C_1$-$C_{12}$ alkyl carboxy ester, acyl, $C_1$-$C_{12}$ alkoxy, carboxylate, or a mixture comprising one or more of the foregoing groups;

$x+y+z=100$ mol %;

x and y are each independently 10 to 70 mol %; and
z is less than or equal to 40 mol %.

2. The composition of claim 1, wherein A has the formula —$CH_2CR^4R^5$, $R^4$ and $R^5$ are each independently a $C_1$-$C_{10}$ linear or branched alkyl, alkenyl, or alkaryl group, or a $C_3$-$C_{10}$ cycloalkyl or cycloalkenyl group.

3. The composition of claim 1, wherein $R^4$ or $R^5$ or both comprises a site of unsaturation.

4. The composition of claim 1, wherein the ferroelectric polymer comprises a vinylidene fluoride-containing polymer.

* * * * *